United States Patent
Inuzuka et al.

[11] Patent Number: 6,166,620
[45] Date of Patent: Dec. 26, 2000

[54] RESISTANCE WIRING BOARD AND METHOD FOR MANUFACTURING THE SAME

[75] Inventors: Tsutomu Inuzuka; Satoshi Tomioka; Shigeo Furukawa; Tsuyoshi Himori; Suzushi Kimura, all of Osaka, Japan

[73] Assignee: Matsushita Electric Industrial Co., Ltd., Osaka, Japan

[21] Appl. No.: 09/242,425

[22] PCT Filed: Jun. 12, 1998

[86] PCT No.: PCT/JP98/02602

§ 371 Date: Apr. 8, 1999

§ 102(e) Date: Apr. 8, 1999

[87] PCT Pub. No.: WO98/58390

PCT Pub. Date: Dec. 23, 1998

[30] Foreign Application Priority Data

Jun. 16, 1997 [JP] Japan .................................. 9-158372
May 20, 1998 [JP] Japan ................................ 10-137986
May 14, 1998 [JP] Japan ................................ 10-131637

[51] Int. Cl.[7] .................................................. H01C 1/012
[52] U.S. Cl. ........................... 338/309; 338/308; 338/311; 338/323; 338/332
[58] Field of Search .................................... 338/308, 309, 338/311, 323, 332

[56] References Cited

U.S. PATENT DOCUMENTS

| | | | |
|---|---|---|---|
| 2,475,379 | 7/1949 | Stong | 338/309 |
| 3,434,877 | 3/1969 | Degenkolb et al. | 338/309 |
| 4,015,230 | 3/1977 | Nitta et al. | 338/308 |
| 4,016,525 | 4/1977 | Maher et al. | 338/309 |
| 4,104,421 | 8/1978 | Maher et al. | 338/309 |
| 4,737,757 | 4/1988 | Senda et al. | 338/308 |
| 4,792,781 | 12/1988 | Takahashi et al. | 338/308 |
| 4,949,065 | 8/1990 | Watanabe et al. | 338/308 |
| 5,210,516 | 5/1993 | Shikama et al. | 338/309 |
| 5,510,594 | 4/1996 | Mori et al. | 338/309 |
| 5,557,252 | 9/1996 | Ariyoshi | 338/309 |
| 5,955,938 | 9/1999 | Fukaya | 338/309 |
| 5,966,067 | 10/1999 | Murakami et al. | 338/309 |
| 6,005,474 | 12/1999 | Takeuchi et al. | 338/309 |

FOREIGN PATENT DOCUMENTS

| | | |
|---|---|---|
| 47-24589 | 10/1972 | Japan . |
| 64-22379 | 1/1989 | Japan . |
| 64-42359 | 2/1989 | Japan . |
| 7-283006 | 10/1995 | Japan . |
| 7-335402 | 12/1995 | Japan . |

OTHER PUBLICATIONS

Search Report corresponding to application No. PCT/JP98/02602 dated Sep. 16, 1998.
English translation of Form PCT/ISA/210 (No Month/Date).

*Primary Examiner*—Cathy Lam
*Attorney, Agent, or Firm*—Ratner & Prestia

[57] ABSTRACT

A resistance wiring board having a cavity disposed on an insulated substrate, a resistance disposed in the cavity, a protective film disposed on a top face of the resistance, and electrodes electrically connected at near both ends of the resistance, wherein surfaces of the electrodes and a surface of the protective film are the same level as or lower than a surface of the wiring board. A method for manufacturing a resistance wiring board comprising the steps of forming a green sheet, forming an electrode pattern on the green sheet, forming a dented pattern on the green sheet, firing the green sheet, forming a resistance by filling a resistance material in the dent of the green sheet, and forming a protective film on a top face of the resistance.

21 Claims, 8 Drawing Sheets

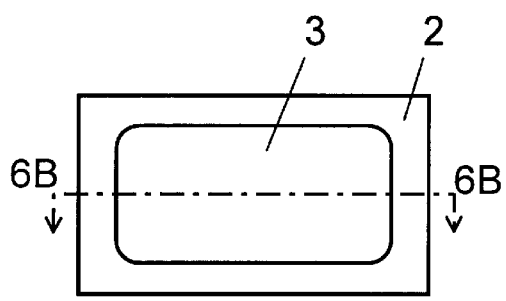
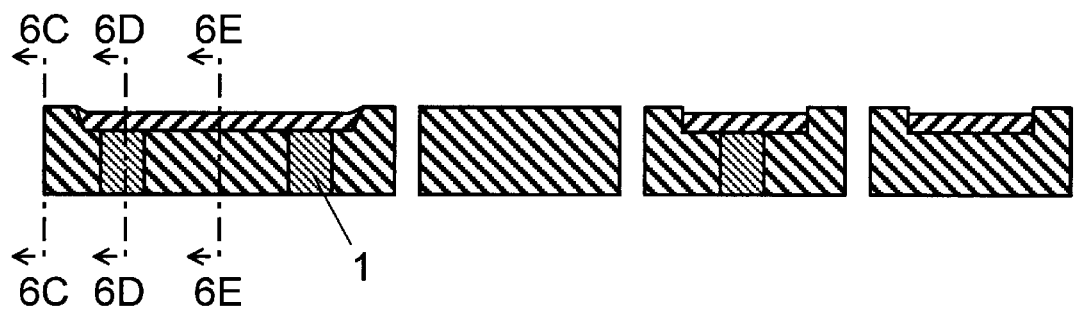

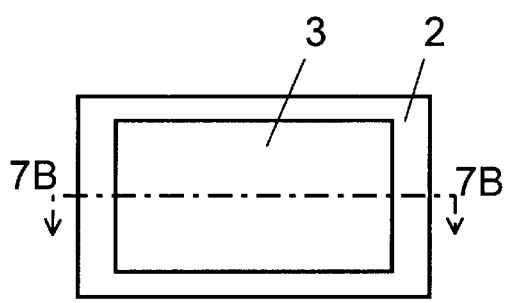
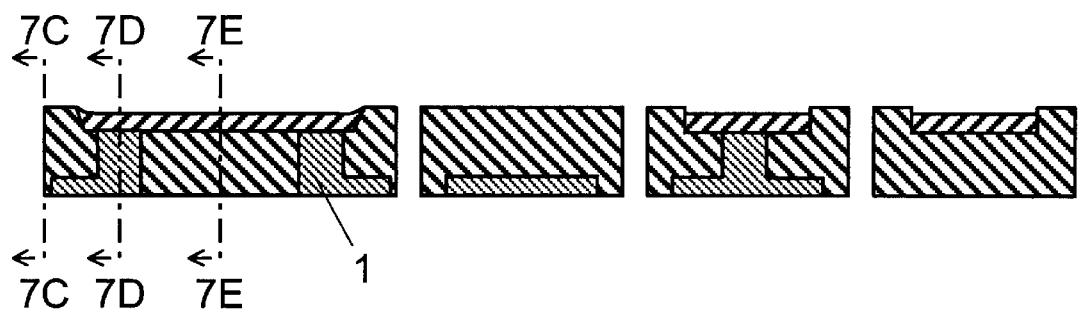

RESISTANCE WIRING BOARD AND METHOD FOR MANUFACTURING THE SAME

THIS APPLICATION IS A U.S. NATIONAL PHASE APPLICATION OF PCT INTERNATIONAL APPLICATION PCT/JP98/02602.

FIELD OF THE INVENTION

The present invention relates to the field of resistance wiring boards used for a wide range of types of electronic components, particularly for chip resistors, and their manufacturing methods.

BACKGROUND OF THE INVENTION

Conventionally, a resistance 6 is formed in a resistance wiring board as described in the following steps shown in FIGS. 8A to 8E. An insulated substrate 4 typically containing alumina (aluminum oxide, $Al_2O_3$) is fired at around 1,600° C., and electrode paste such as Ag is printed on the fired insulated substrate 4. It is then fired at around 850° C. to form an electrode 5. Resistance paste made typically of $RuO_2$ and glass paste to create an insulated protective film are then printed and fired at around 650° C. to complete the resistance 6.

When a resistance wiring board is used as a laminated substrate, electrode paste and resistance paste are patterned on a green sheet of low-temperature firing substrate made typically of glass-aluminum by means of such as printing, and then fired at around 900° C.

The accuracy of the resistance value depends chiefly on the accuracy of the pattern position and shape. One known method is disclosed in Japanese Laid-open Patent No. H1-22379. A circumferential wall is formed using solder resist after forming an electrode in an insulated substrate to prevent the pattern from smearing, and then the resistance is provided in that cavity so as to improve the accuracy of the resistance value.

However, in conventional methods, including the above method, to form the resistance in a cavity for resistance after forming the electrode, a contact face of the electrode and resistance configuring the resistance wiring board is located higher than the level of the surface of the insulated substrate. Accordingly, the electrode surface or resistance surface protrudes from the surface of the insulated substrate, preventing attempts to reduce the height of the resistance wiring board.

When the resistance wiring board is used as a chip resistance, a face-down system involving mounting the resistance wiring board with the electrode side facing down onto the printed wiring board assists increased component mounting density. However, since the resistance surface is higher than the electrode surface in the conventional method as described above, face-down mounting involves practical difficulties.

Furthermore, variations in the thickness of the resistances or variations in resistance values due to difficulties in ensuring that the resistance thoroughly fills to the edges of the cavity may occur as a result of simply providing a resistance in the cavity.

When a low-temperature firing substrate made typically of glass-aluminum and electrode are integrally fired to reduce the height of the resistance wiring substrate, the heat conductivity of the insulated substrate may deteriorate, resulting in overload due to buildup of heat in the resistance.

SUMMARY OF THE INVENTION

The present invention solves the above disadvantages. In the present invention, the electrode surface and the resistance surface are on the same or at a lower level than the surface of the resistance wiring board. One object of the present invention is to achieve a resistance wiring board with high resistance accuracy and good overload characteristics, and which is suitable for face-down mounting.

To achieve this object, a Pd—Ag electrode contains Pd at 60 wt % or more in a resistance wiring board of the present invention on which the resistance is formed between the electrodes. An insulated substrate is made of an aluminum substrate containing 1.5 to 2.5 wt % $TiO_2$, 1.5 to 2.5 wt % MnO, and 1.5 to 4.5 wt % $SiO_2$. A boundary phase containing, also called herein a reaction phase, a higher quantity of Mn than inside the aluminum substrate is provided on the boundary between the aluminum substrate and the electrode. This structure realizes an electrode integrated substrate with good heat conductivity, resulting in a resistance wiring board with good overload characteristics.

In addition, the resistance is formed in a concavity provided on the insulated substrate, and the electrode is electrically connected close to both ends of the resistance. Since the level of the electrode surface and the resistance surface are the same or lower than the surface of the resistance wiring board, the electrode and resistance are no thicker than the resistance wiring substrate, enabling a reduced-height resistance wiring substrate to be achieved.

BRIEF DESCRIPTION OF THE DRAWINGS

FIGS. 6A to 6E is a configuration of a resistance wiring board in accordance with seventh and twelfth exemplary embodiments of the present invention.

FIGS. 7A to 7E is a configuration of a resistance wiring board in seventh and twelfth exemplary embodiments of the present invention.

DESCRIPTION OF THE PREFERRED EMBODIMENT

First Exemplary Embodiment

Figure 1A:
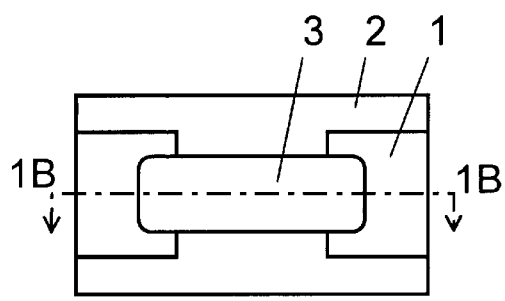
FIGS. 1A to 1E shows a configuration of a resistance wiring board in accordance with second, eighth, tenth, and thirteenth exemplary embodiments of the present invention.
Figures 1B, 1C, 1D, 1E:
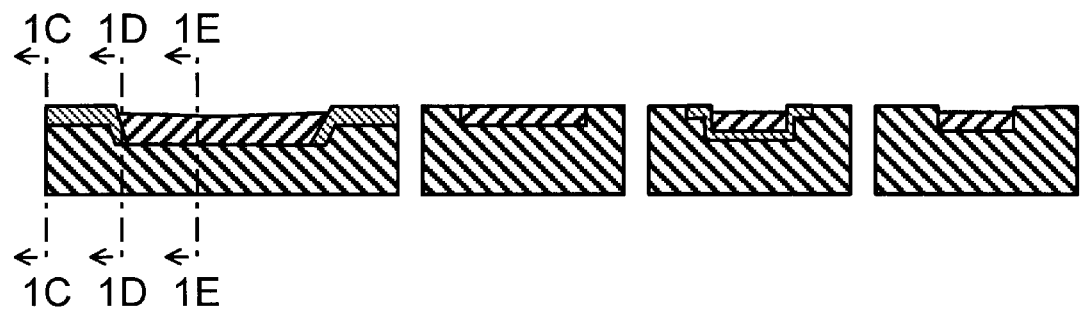

A method for manufacturing a resistance wiring board in a first exemplary embodiment of the present invention comprises the following steps. A first step is to form a green sheet, using the doctor blade method, from a slurry made by mixing and dispersing alumina (aluminum) oxide, $Al_2O_3$)

powder, the additives shown in Table 1, butyral resin, plasticizer, and solvent. A second step is to form an electrode pattern by screen-printing Pd—Ag paste with the composition shown in Table 1 onto the green sheet created in the first step. A third step is to fire the green sheet after the second step at a temperature appropriate to obtain a dense fired substrate. Finally, a fourth step is to print resistance paste made of oxidized ruthenium system, a resistance material, between the electrodes on the fired body after the third step, followed by printing of glass paste as a resistance protective film, and fire at 650° C.

The present invention (Specimens 1 to 10) created using the above steps comprises Pd—Ag system or Pd electrodes containing 60 wt % or more Pd; an aluminum substrate containing $TiO_2$ at 1.5 to 2.5 wt %, MnO at 1.5 to 2.5 wt %, and $SiO_2$ at 1.5 to 4.5 wt %; and a resistance body made of oxidized ruthenium system overcoated with glass.

For comparison, a green sheet made of glass-aluminum, Ag paste, resistance paste made of oxidized ruthenium system, and glass paste are used in the same steps as the present invention to create Comparison 1. To evaluate the overload characteristics of these products, power of $\frac{1}{16}$ W was applied to each resistance in a cycle of ON for 1 second and OFF for 10 seconds. After 10,000 cycles, change ratio in resistance was calculated as a percentage. In addition, a tensile strength test of each electrode formed was conducted to check the adhesion strength of the insulated substrate and electrode. Table 1 shows the comparison results.

TABLE 1

| Specimen No. | Additives to insulated substrate ( wt %) | | | Pd content in electrode (wt %) | Intermittent overload test Change in Resistance value (%) | Electrode tensile strength (kgf/mm$^2$) |
|---|---|---|---|---|---|---|
| | $TiO_2$ | MnO | $SiO_2$ | | | |
| 1 | 1.5 | 1.5 | 1.5 | 100 | −2.2 | 3.8 |
| 2 | 2.5 | 1.5 | 1.5 | 100 | −2.5 | 3.7 |
| 3 | 1.5 | 2.5 | 1.5 | 100 | −3.3 | 3.8 |
| 4 | 2.5 | 2.5 | 1.5 | 100 | −2.2 | 3.9 |
| 5 | 2.0 | 1.5 | 3.0 | 80 | −2.8 | 3.9 |
| 6 | 2.0 | 2.5 | 3.0 | 80 | −3.8 | 3.7 |
| 7 | 1.5 | 1.5 | 4.5 | 80 | −3.9 | 3.9 |
| 8 | 2.5 | 1.5 | 4.5 | 60 | −5.1 | 3.7 |
| 9 | 1.5 | 2.5 | 4.5 | 60 | −5.5 | 3.7 |
| 10 | 2.5 | 2.5 | 4.5 | 60 | −6.2 | 3.8 |
| Comparison 1 | Glass-aluminum | | | 0 | 72 | 3.1 |

It is apparent that the present invention has better overload characteristics and better adhesive strength than those observed in Comparison 1.

Second Exemplary Embodiment

A method for manufacturing a resistance wiring board in a second exemplary embodiment of the present invention comprises the following steps. A first step is to form a green sheet, using the doctor blade method, from a slurry made by mixing and dispersing a mixed powder of aluminum, $TiO_2$, MnO, and $SiO_2$ in a weight ratio of 94:2:2:2, with butyral resin, plasticizer, and solvent. A second step is to form an electrode pattern by screen-printing Pd paste onto the green sheet made in the first step. A third step is to use a mold to form a dent with a depth of 40 μm between electrode patterns on the green sheet after the second step. A fourth step is to fire the molded body after the third step at a temperature appropriate to obtain a dense fired substrate. A fifth step is to fill resistance paste made of oxidized ruthenium system and glass paste into the dent on the fired body in the fourth step, and then to fire at 650° C.

The present invention (Specimen 11) made using the above steps comprises the electrode 1, insulated substrate 2, and resistance 3, as shown in FIG. 1A. The electrode 1 and resistance 3 are configured in a way that they are at the same level as, or lower than the surface of the insulated substrate 2. FIGS. 1B to 1E illustrate cross-sections of FIG. 1A.

For comparison, a 96% aluminum substrate is fired at 1600° C., an Ag paste electrode pattern is printed on the fired substrate and then fired at 850° C., and oxidized ruthenium system resistance paste and glass paste are printed between electrodes and then fired at 650° C. to make a resistance wiring substrate (Comparison 2).

Table 2 shows a comparison between Specimen 11 and Comparison 2 with respect to maximum thickness and variations in resistance value when 50 resistances are measured.

TABLE 2

| | Maximum thickness (μm) | Variations in resistance value (%) |
|---|---|---|
| Specimen 11 | 200 | ±6 |
| Comparison 2 | 200 | ±12 |

The maximum thickness of Specimen 11 was 200 μm, whereas that of Comparison 2 was 230 μm. The present invention is thus effective in reducing the height of resistance wiring boards. In addition, variations in the resistance value was reduced by about 50%, contributing to increased accuracy of resistance values.

Third Exemplary Embodiment

A method for manufacturing a resistance wiring board in a third exemplary embodiment of the present invention comprises the following steps. A first step is to form a green sheet, using the doctor blade method, from a slurry made by mixing and dispersing a mixed powder with the same composition as the second exemplary embodiment, with butyral resin, plasticizer, and solvent. A second step is to form an electrode pattern by screen-printing Pd paste onto the green sheet made in the first step. A third step is to use a mold to form a dent with a depth of 40 μm between electrode patterns on the green sheet after the second step. Here, the dent is formed in a way that the electrode pattern and the bottom face of the dent overlap. A fourth step is to fire the molded body obtained in the third step at a temperature appropriate to obtain a dense fired substrate. A fifth step is to fill resistance paste made of oxidized ruthenium system and glass paste into the dent on the fired body in the fourth step, and then fire at 650° C.

Figure 2A:
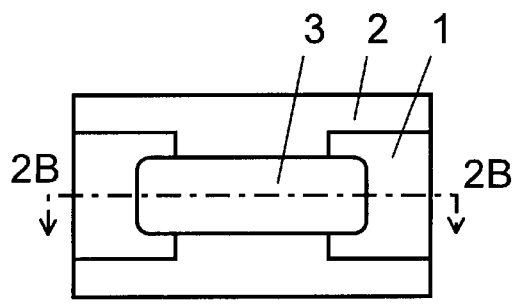
FIGS. 2A to 2E shows a configuration of a resistance wiring board in accordance with third and eleven exemplary embodiments of the present invention.
Figures 2B, 2C, 2D, 2E:
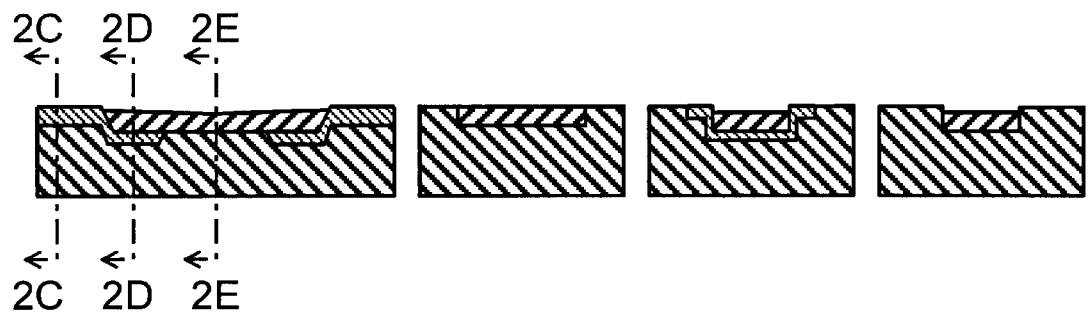

The present invention (Specimen 12) made using the above steps comprises the electrode 1, insulated substrate 2, and resistance 3, as shown in FIG. 2A. Unlike the electrode 1 in FIG. 1A in which a part of the electrode 1 contacts only the side face of the resistance 3, the electrode 1 in the third exemplary embodiment contacts the side face and bottom face of the resistance 3. In addition, the electrode 1 and resistance 3 are at the same level as, or lower than the surface of the insulated substrate 2. FIGS. 2B to 2E illustrate cross-sections of FIG. 2A.

More specifically, at forming a dent using the mold, the surface is pressed with the mold in order that a part of the electrode 1 remains on the bottom face. Even an area of the electrode 1 remaining on the bottom face is slightly different due to mis-alignment of the mold during pressing, a distance between the electrodes 1 can be maintained at a certain interval. Accordingly, variations in resistance value can be minimized.

Table 3 shows a comparison between Specimen 12 and Comparison 2 with respect to the maximum thickness and variations in resistance value when 50 resistances are measured.

TABLE 3

|  | Maximum thickness ($\mu$m) | Variations in resistance value (%) |
|---|---|---|
| Specimen 12 | 198 | ±4.8 |
| Comparison 2 | 230 | ±12 |

The maximum thickness of Specimen 12 was 198 $\mu$m, whereas that of Comparison 2 was 230 $\mu$m. The present invention is thus effective in reducing the height of resistance wiring boards. In addition, variations in the resistance value was reduced to about 40%, contributing to increased accuracy of resistance values.

Fourth Exemplary Embodiment

A method for manufacturing a resistance wiring board in a fourth exemplary embodiment of the present invention comprises the following steps. A first step is to form a green sheet, using the doctor blade method, from a slurry made by mixing and dispersing mixed powder with the same composition as the second exemplary embodiment with butyral resin, plasticizer, and solvent. A second step is to form an electrode pattern by screen-printing Pd paste on the green sheet made in the first step. A third step is to use a mold to form a dent with a minimum depth of 40 $\mu$m and maximum depth of 50 $\mu$m between electrode patterns on the green sheet after the second step. This dent is a concavity which is deeper towards the center. A fourth step is to fire the molded body produced in the third step at a temperature appropriate to obtain a dense fired substrate. A fifth step is to fill oxidized ruthenium system resistance paste and glass paste into the dent on the fired body after the fourth step, and then fire at 650° C.

Here the dent is set to a depth between 40 and 50 $\mu$m to create a resistance of about 10 $\mu$m thick. This takes into account the fact that the thickness of the resistance paste may fall to about 25% as a result of the drying and firing processes, although it depends on the characteristics of the resistance paste. Therefore, the depth of the dent needs to be designed based on a required film thickness of the resistance.

Figure 3A:
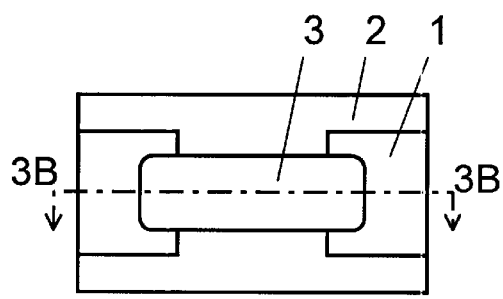
FIGS. 3A to 3E is a configuration of a resistance wiring board in accordance with a fourth exemplary embodiment of the present invention.
Figures 3B, 3C, 3D, 3E:
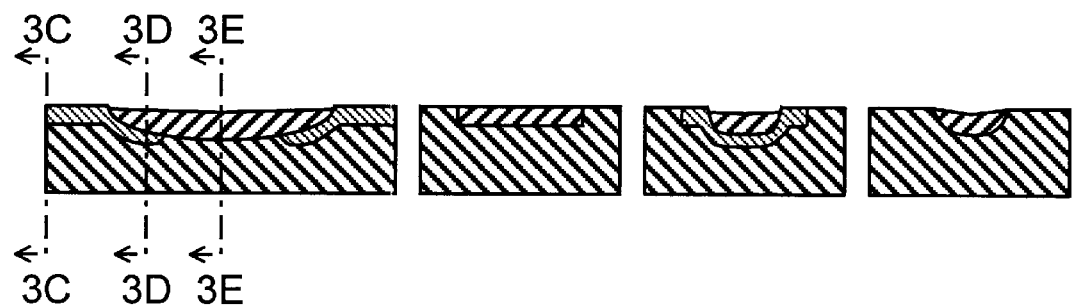

The present invention (Specimen 13) made using the above steps comprises the electrode 1, insulated substrate 2, and resistance 3, as shown in FIG. 3A. The dent is curved in a way that a part of the electrode 1 is deepened toward the center. The surfaces of the electrode 1 and resistance 3 are also configured in a way that they are at the same level as, or lower than that of the insulated substrate 2. FIGS. 3B to 3E illustrate cross-sections of FIG. 3A.

The above configuration makes it possible to minimize variations in the resistance value by eliminating any space left when filling the resistance 3 and removing any unfilled spaces in the corners which may occur when the dent is a rectangle.

Table 4 shows a comparison of the maximum thickness of Specimen 13 and Comparison 2, and variations in the resistance value when 50 resistances are measured.

TABLE 4

|  | Maximum thickness ($\mu$m) | Variations in resistance value (%) |
|---|---|---|
| Specimen 13 | 200 | ±4.2 |
| Comparison 2 | 230 | ±12 |

The maximum thickness of Specimen 13 was 200 $\mu$m, whereas that of Comparison 2 was 230 $\mu$m. The present invention is thus effective in reducing the height of resistance wiring boards. In addition, variations in the resistance value was reduced to about 35%, contributing to increased accuracy of resistance values.

Fifth Exemplary Embodiment

A method for manufacturing a resistance wiring board in a fifth exemplary embodiment of the present invention comprises the following steps. A first step is to form a green sheet, using the doctor blade method, from a slurry made by mixing and dispersing mixed powder with the same composition as the second exemplary embodiment with butyral resin, plasticizer, and solvent. A second step is to form an electrode pattern by screen-printing Pd paste on the green sheet made in the first step. A third step is to use a mold to form a dent with a minimum depth of 40 $\mu$m and maximum depth of 50 $\mu$m between electrode patterns on the green sheet after the second step. This dent is a concavity which is partially made deeper at both ends. A fourth step is to fire the molded body produced in the third step at a temperature appropriate to obtain a dense fired substrate. A fifth step is to fill oxidized ruthenium system resistance paste and glass paste into the dent on the fired body after the fourth step, and then fire at 650° C.

Figure 4A:
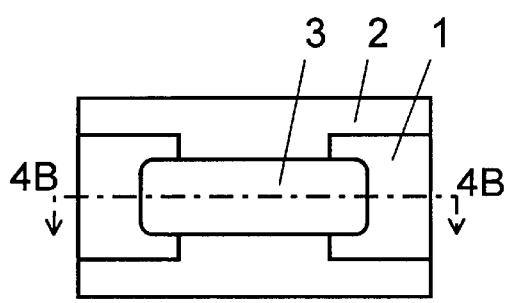
FIGS. 4A to 4E is a configuration of a resistance wiring board in accordance with a fifth exemplary embodiment of the present invention.
Figures 4B, 4C, 4D, 4E:
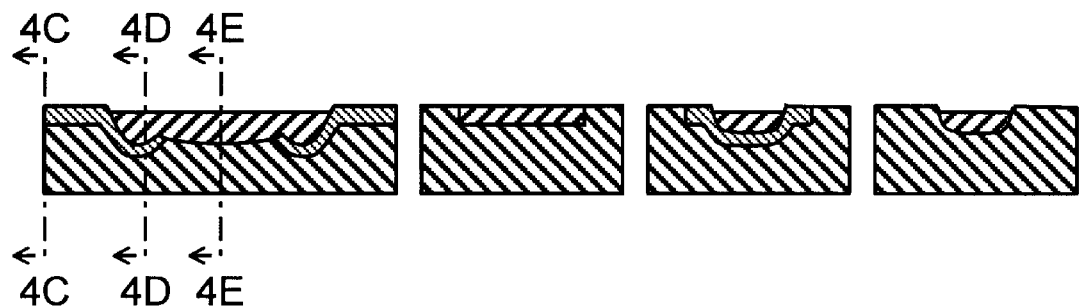

The present invention (Specimen 14) made using the above steps comprises the electrode 1, insulated substrate 2, and resistance 3, as shown in FIG. 4A. The dent is made into a concave shape to make a part of the electrode 1 partially deepened at both ends. The surfaces of the electrode 1 and resistance 3 are also configured in a way that they are at the same level as, or lower than that of the insulated substrate 2. FIGS. 3B to 3E illustrate cross-sections of FIG. 3A.

This accelerates the leveling of the resistance paste as a result of its flow, making it possible to increase the level difference between the surfaces of the electrode 1 and resistance 3.

Table 5 shows a comparison of the maximum thickness of Specimen 14 and Comparison 2, and variations in the resistance value when 50 resistances are measured.

TABLE 5

|  | Maximum thickness ($\mu$m) | Variations in resistance value (%) | Level difference between electrode surface and resistance surface ($\mu$m) |
|---|---|---|---|
| Specimen 14 | 200 | ±5.0 | 90 |
| Specimen 11 | 200 | ±6.0 | 70 |
| Comparison 2 | 230 | ±12 | — |

The maximum thickness of Specimen 14 was 200 $\mu$m, whereas that of Comparison 2 was 230 $\mu$m. The present invention is thus effective in reducing the height of resistance wiring boards. In addition, variations in the resistance value is reduced to about 40%, contributing to increased accuracy of resistance values.

Furthermore, the level difference between resistance surface and electrode surface at both ends of the resistance, which is the maximum height of the resistance surface, was 90 μm in Specimen 14 and 70 μm in Specimen 11. Specimen 14 shows that it is possible to secure sufficient distance between the resistance and a printed wiring board even though Specimen 14 is mounted with the resistance side facing down toward the printed circuit board. Accordingly, it is advantageous for face-down mounting.

Sixth Exemplary Embodiment

A method for manufacturing a resistance wiring board in a sixth exemplary embodiment of the present invention comprises the following steps. A first step is to form a green sheet, using the doctor blade method, from a slurry made by mixing and dispersing mixed powder with the same composition as the second exemplary embodiment with butyral resin, plasticizer, and solvent. A second step is to sandwich and press the green sheet made in the first step with a pair of flat molds whose surface contacting the green sheet is made rough. A third step is to form an electrode pattern by screen-printing Pd paste on the green sheet made in the second step. A fourth step is to use a mold to form a dent with a depth of 40 μm between electrode patterns on the green sheet after the third step. A fifth step is to fire the molded body produced in the fourth step at a temperature appropriate to obtain a dense fired substrate. A sixth step is to fill oxidized ruthenium system resistance paste and glass paste into the dent on the fired body after the fifth step, and then fire at 650° C.

Figure 5A:
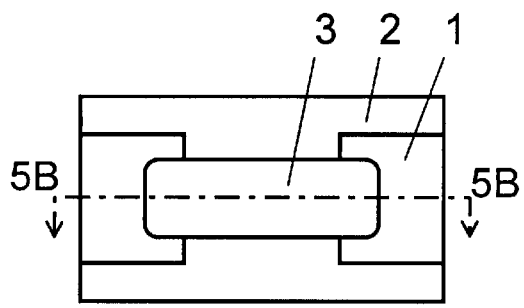
FIGS. 5A to 5E is a configuration of a resistance wiring board in accordance with a sixth exemplary embodiment of the present invention.
Figures 5B, 5C, 5D, 5E:
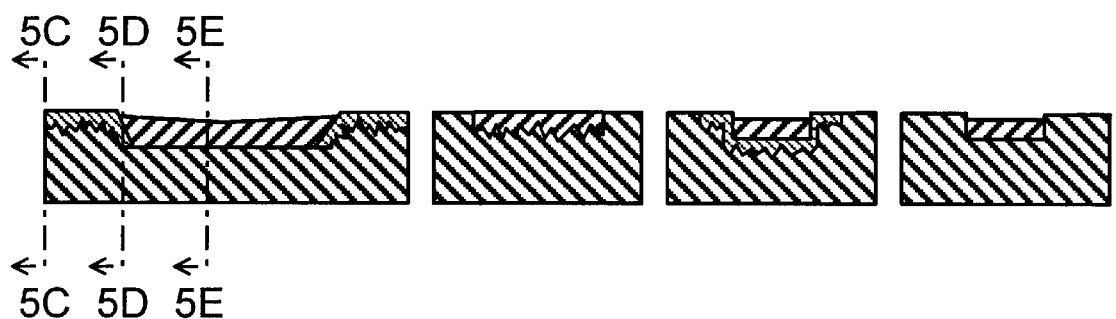
Figure 8A:
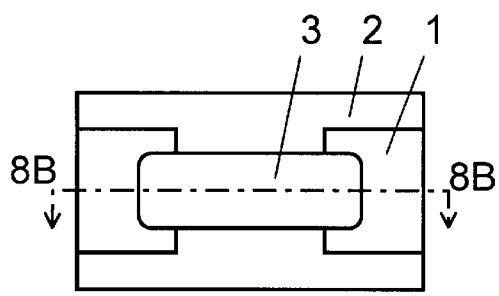
FIGS. 8A to 8E is a configuration of a resistance wiring substrate of the prior art.
Figures 8B, 8C, 8D, 8E:
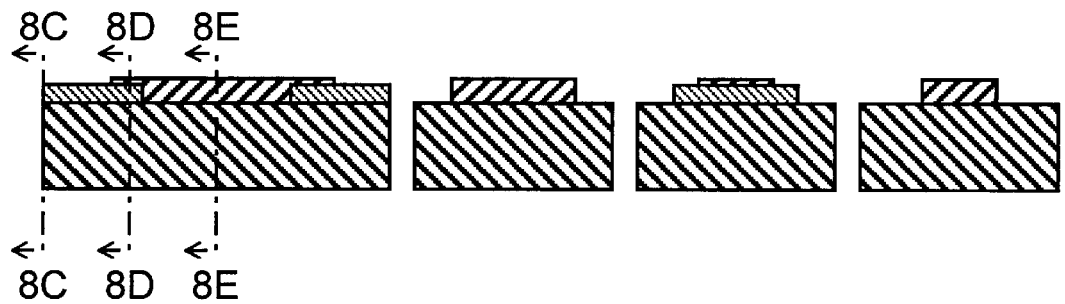

The present invention (Specimen 15) made using the above steps comprises the electrode 1, insulated substrate 2, and resistance 3, as shown in FIG. 5A. Numerous minute concavities and convexities are provided on the boundary face of the insulated substrate 2 and electrode 1. The surfaces of the electrode 1 and resistance 3 are also configured in a way that they are at the same level as, or lower than that of the insulated substrate 2. FIGS. 5B to 5E illustrate cross-sections of FIG. 5A.

This generates the anchor effect at the boundary of the insulated substrate 2 and electrode 1, increasing the adhesion strength of the electrodes. In addition, concavities and convexities broaden the contact area between the electrode and insulated substrate. This improves heat conductivity, resulting in better overload characteristics.

Table 6 shows a comparison of the maximum thickness, electrode adhesion strength, and overload characteristics of Specimen 15 and Comparison 2.

TABLE 6

|  | Maximum thickness (μm) | Variations in resistance value (%) | Intermittent overload test Change in resistance value (%) | Electrode tensile strength (kgf/mm2) |
|---|---|---|---|---|
| Specimen 15 | 210 | ±6.0 | −1.1 | 4.2 |
| Specimen 11 | 200 | ±6.0 | −2.2 | 3.9 |
| Comparison 2 | 230 | ±12 | −1.6 | 3.2 |

The maximum thickness of Specimen 15 was 210 μm, whereas that of Comparison 2 was 230 μm. The present invention is thus effective in reducing the height of resistance wiring boards. In addition, variations in the resistance value was reduced by about 50%, contributing to increased accuracy of resistance values.

Furthermore, it is apparent from Table 6 that electrode tensile strength and overload characteristics of Specimen 15 are better than those of Specimen 11 and Comparison 2.

Seventh Exemplary Embodiment

A method for manufacturing a resistance wiring board in a seventh exemplary embodiment of the present invention comprises the following steps. A first step is to form a green sheet, using the doctor blade method, from a slurry made by mixing and dispersing mixed powder with the same composition as the second exemplary embodiment with butyral resin, plasticizer, and solvent. A second step is to pierce the green sheet made in the first step. A third step is to fill Pd electrode paste into holes on the green sheet made in the second step, and as required, to form an electrode pattern on the green sheet with the Pd electrode paste in a way to contact with the Pd electrode paste filled into the holes. A fourth step is to use a mold to form a dent with a depth of 40 μm on a face on which the electrode pattern is not printed on the green sheet after the third step. A fifth step is to fire the molded body produced in the fourth step at a temperature appropriate to obtain a dense fired substrate. A sixth step is to fill oxidized ruthenium system resistance paste and glass paste into the dent on the fired body after the fifth step, and then fire at 650° C.

The present invention (Specimens 16 and 17) made using the above steps comprises the electrode 1, insulated substrate 2, and resistance 3, as shown in FIGS. 6A and 7A. The electrode 1 is formed through via holes or through holes on the surface on which the resistance 3 is not formed. This makes the contact area between the electrode 1 and resistance 3 uniform. The surfaces of the electrode 1 and resistance 3 are also configured in a way that they are at the same level as, or lower than that of the insulated substrate 2. FIGS. 6B to 6E and FIGS. 7B to 7E illustrate cross-sections of FIG. 6A and FIG. 7A, respectively.

In addition, the electrode 1 shown in FIG. 7A has a larger exposed area compared to that shown in FIG. 6A, enabling more secure connection.

Table 7 shows a comparison of the maximum thickness of Specimen 16 and 17 and Comparison 2, and variations in the resistance value when 50 resistances are measured.

TABLE 7

|  | Maximum thickness (μm) | Variations in resistance value (%) |
|---|---|---|
| Specimen 16 | 196 | ±4.5 |
| Specimen 17 | 198 | ±4.5 |
| Comparison 2 | 230 | ±12 |

The maximum thickness of Specimens 16 and 17 were respectively 196 μm and 198 μm, whereas that of Comparison 2 was 230 μm. The present invention is thus effective in reducing the height of resistance wiring boards. In addition, variations in the resistance value was reduced to about 38%, contributing to increased accuracy of resistance values.

Eighth Exemplary Embodiment

A method for manufacturing a resistance wiring board in an eighth exemplary embodiment of the present invention comprises the following steps. A first step is to form a green sheet, using the doctor blade method, from a slurry made by mixing and dispersing mixed powder with the same composition as the second exemplary embodiment with butyral resin, plasticizer, and solvent. A second step is to form an electrode pattern by screen-printing Pd paste on the green sheet made in the first step. A third step is to use a mold to form a dent with a depth of 40 μm between electrode patterns on the green sheet after the second step. A fourth step is to fire the molded body produced in the third step at a temperature appropriate to obtain a dense fired substrate. A fifth step is to fill oxidized ruthenium system resistance paste as resistance material into the dent on the fired body after the fourth step. A sixth step is to polish the surface of the substrate produced in the fifth step. A seventh step is to fire the substrate after the sixth step at 650° C. An eighth step is to fill fired glass paste obtained in the seventh step, and then fire at 650° C.

The present invention (Specimen 18) made using the above steps comprises the electrode 1, insulated substrate 2, and resistance 3, as shown in FIG. 1A. The electrode 1 and resistance 3 are configured in a way that they are at the same level as, or lower than the surface of the insulated substrate 2.

Table 8 shows a comparison of the maximum thickness of Specimen 18 and Comparison 2, and variations in the resistance value when 50 resistances are measured.

TABLE 8

|  | Maximum thickness (μm) | Variations in resistance value (%) |
| --- | --- | --- |
| Specimen 18 | 198 | ±4.8 |
| Comparison 2 | 230 | ±12 |

The maximum thickness of Specimen 18 was 198 μm, whereas that of Comparison 2 was 230 μm. The present invention was thus effective in reducing the height of resistance wiring boards. In addition, variations in the resistance value is reduced to about 40%, contributing to increased accuracy of resistance values.

The temperature for firing the green sheet and electrode paste is preferably between 1100° C., which is the lower limit for sufficiently compacting the substrate, and 1500° C., which is the melting point of Pd. When percentages of $TiO_2$, MnO, and $SiO_2$ are below 1.5 wt %, a dense insulated substrate cannot be achieved even at 1500° C., the upper limit for firing the electrode material. When the percentages of $TiO_2$ and MnO exceed 2.5 wt % and that of $SiO_2$ exceeds 4.5 wt %, the heat conductivity of the insulated material degrades, resulting in poor overload characteristics. Accordingly, it is preferable to add between 1.5 and 2.5 wt % of $TiO_2$, between 1.5 and 2.5 wt % of MnO, and between 1.5 and 4.5 wt % of $SiO_2$. For electrode paste, Ag may be added to Pd up to 40 wt %, depending on the substrate firing temperature. In other words, when Ag is added to electrode paste at a rate of 40 wt % or more, the electrode paste melts at 1100° C., which is the lower limit of the substrate firing temperature, and causes contact with a part of the electrodes. Thus, up to 40 wt % of Ag is preferably added. Since the electrode is formed by firing electrode paste at a substrate firing temperature of between 1100° C. and 1500° C., Ag may not necessarily be added.

According to a microprobe analysis of composition, a reaction phase containing more Mn element than inside the aluminum substrate exists at the boundary between the aluminum substrate and electrode. This proves that the aluminum substrate and electrode are securely bonded.

In the above explanation, a glass layer is formed on resistance material such as oxidized ruthenium as a protective coating to secure electrical insulation from the outside. A resin coating may be applied instead of a glass coating. In addition, the depth of the dent, where the resistance is formed, is preferably a half or less of the thickness of the green sheet, since distortion of the molded body worsens as the dent becomes deeper. The dent may also be inclined at the edge to facilitate mold release. This is also included in the intention of the present invention.

Furthermore, in the above explanation, one resistance is disposed on the insulated substrate. More than one resistance may be disposed on the insulated substrate in cases such as network resistors or multi-chip resistors. When a circuit is configured by a conductor, the effectiveness of the present invention can be preserved by providing more than one dent on the mold.

The same results are achieved when $MnO_2$ or $Mn_2O_3$ is used instead of MnO in the above explanation.

The same effect is also achieved when a powder material with the composition shown in Table 1 is used in the second to eighth exemplary embodiments.

Ninth Exemplary Embodiment

A method for manufacturing a resistance wiring board in a ninth exemplary embodiment of the present invention comprises the following steps. A first step is to form a green sheet, using the doctor blade method, from a slurry made by mixing and dispersing aluminum powder and additives shown in Table 9 with butyral resin, plasticizer, and solvent. A second step is to form an electrode by screen-printing conductive paste made of Pd mixed with 1 wt % of Pt on the green sheet made in the first step. A third step is to fire the green sheet produced in the second step at a temperature appropriate to obtain a dense fired substrate. Finally, a fourth step is to print resistance paste made of oxidized ruthenium system, a resistance material, between the electrodes on the fired body after the third step, followed by glass paste as a resistance protective film, and fire at 650° C.

The present invention (Specimens 19 to 28) made using the above steps comprises a Pd—Pt system or Pt electrodes containing at least Pt; an aluminum substrate containing $TiO_2$ powder at 1.5 to 2.5 wt %, $MnO_2$ powder at 1.5 to 2.5 wt %, Si powder at 0.5 to 4.0 wt %, and aluminum powder; and a resistance made of oxidized ruthenium system overcoated with glass.

For comparison, Comparison 3 was made by using $SiO_2$ powder instead of Si powder for the amount equivalent to Specimen 25.

Also for comparison, a green sheet made of glass-aluminum, Ag paste, resistance paste made of oxidized ruthenium system, and glass paste were used in the same steps as the present invention to create Comparison 4.

To evaluate the overload characteristics of these products, power of 1/16 W was applied to each resistance in a cycle of ON for 1 second and OFF for 10 seconds. After 10,000 cycles, any change in resistance was calculated as a percentage. In addition, a copper metal bar is soldered onto the electrode to measure its strength using a gauge when the metal bar is pushed sideways. Table 9 shows comparison results.

TABLE 9

| Specimen No. | Additives to insulated substrate (wt %) | | | Intermittent overload test Change in resistance value (%) | Electrode lateral pressure strength (kgf) |
| --- | --- | --- | --- | --- | --- |
| | TiO$_2$ | MnO | SiO$_2$ | | |
| 19 | 1.5 | 1.5 | 0.5 | −2.1 | 1.2 |
| 20 | 2.5 | 1.5 | 0.5 | −2.6 | 1.2 |
| 21 | 1.5 | 2.5 | 0.5 | −3.5 | 1.3 |
| 22 | 2.5 | 2.5 | 0.5 | −2.5 | 1.5 |
| 23 | 2.0 | 1.5 | 1.5 | −3.0 | 1.8 |
| 24 | 2.0 | 2.5 | 1.5 | −3.5 | 2.0 |
| 25 | 1.5 | 1.5 | 4.0 | −4.1 | 2.8 |
| 26 | 2.5 | 1.5 | 4.0 | −5.0 | 2.6 |
| 27 | 1.5 | 2.5 | 4.0 | −5.4 | 2.5 |
| 28 | 2.5 | 2.5 | 4.0 | −6.0 | 2.5 |
| Comparison 3 | Using SiO$_2$ powder (Composition equivalent to Specimen 25) | | | −2.4 | 0.9 |
| Comparison 4 | Glass-aluminum | | | 72 | 1.5 |

It is apparent that the present invention has better electrode lateral pressure strength than Comparison 3.

The present invention also has better overload characteristics compared to Comparison 4.

With respect to firing temperature of the green sheet and electrode paste, it ween 1100° C., the lower limit for sufficiently densifying the substrate, and 1500° C., the melt point of Pd.

Tenth Exemplary Embodiment

A method for manufacturing a resistance wiring board in a tenth exemplary the present invention comprises the following steps. A first step is sheet, using the doctor blade method, from a slurry made by mixing and dispersing a mixed powder of aluminum, TiO$_2$, MnO$_2$, and Si in a weight ratio of 93:1.5:1.5:4.0, with butyral resin, plasticizer, and solvent. A second step is to form an electrode by screen-printing Pd paste containing 1 wt % of Pt onto the green sheet made in the first step. A third step is to use a mold to form a dent with a depth of 40 μm between electrode patterns on the green sheet after the second step. A fourth step is to fire the molded body obtained in the third step at a temperature appropriate to obtain a dense fired substrate. A fifth step is to fill resistance paste made of oxidized ruthenium system and glass paste into the dent on the fired body made in the fourth step, and fire at 650° C.

The present invention (Specimen 29) made using the above steps comprises the electrode 1, insulated substrate 2, and resistance 3, as shown in FIG. 1A. The electrode 1 and resistance 3 are at the same level as, or lower than the surface of the insulated substrate 2.

For comparison, Comparison 5 was made by using SiO$_2$ powder instead of Si powder for the amount equivalent to Specimen 29.

Table 10 shows a comparison between Specimen 29 and Comparisons 4 and 5 with respect to the maximum thickness, variations in resistance value when 50 resistances are measured and electrode lateral pressure strength.

TABLE 10

| | Maximum thickness (μm) | Variations in resistance value (%) | Electrode lateral pressure strength (kgf) |
| --- | --- | --- | --- |
| Specimen 29 | 200 | ±7.0 | 2.6 |
| Comparison 4 | 230 | ±13 | 1.5 |
| Comparison 5 | 200 | ±8 | 1.1 |

It is apparent that the present invention has better electrode lateral pressure strength than that observed in Comparison 5.

The maximum thickness of Specimen 29 was 200 μm, whereas that of Comparison 4 was 230 μm. The present invention is thus effective in reducing the height of resistance wiring boards. In addition, variations in the resistance value was reduced by about 50%, contributing to increased accuracy of resistance values.

Eleventh Exemplary Embodiment

A method for manufacturing a resistance wiring board in an eleventh exemplary embodiment of the present invention comprises the following steps. A first step is to form a green sheet, using the doctor blade method, from a slurry made by mixing and dispersing a mixed powder with the same composition as the tenth exemplary embodiment, with butyral resin, plasticizer, and solvent. A second step is to form an electrode by screen-printing Pd paste onto the green sheet made in the first step. A third step is to use a mold to form a dent with a depth of 40 μm between electrode patterns on the green sheet after the second step. Here, the dent is formed in a way that the electrode pattern and the bottom face of the dent overlap. A fourth step is to fire the molded body obtained in the third step at a temperature appropriate to obtain a dense fired substrate. A fifth step is to fill resistance paste made of oxidized ruthenium system and glass paste into the dent on the fired body made in the fourth step, and then to fire at 650° C.

The present invention (Specimen 30) made using the above steps comprises the electrode 1, insulated substrate 2, and resistance 3, as shown in FIG. 2A. Unlike the electrode 1 in FIG. 1A in which a part of the electrode 1 contacts only the side face of the resistance 3, the electrode 1 in the eleventh exemplary embodiment contacts the side face and bottom face of the resistance 3. In addition, the electrode 1 and resistance 3 are at the same level as, or lower than the surface of the insulated substrate 2.

For comparison, Comparison 6 was made by using SiO$_2$ powder instead of Si powder for the amount equivalent to Specimen 29.

Table 11 shows a comparison between Specimen 30 and Comparisons 4 and 6 with respect to the maximum thickness, variations in resistance value when 50 resistances are measured, and electrode lateral pressure strength.

TABLE 11

| | Maximum thickness (μm) | Variations in resistance value (%) | Electrode lateral pressure strength (kgf) |
| --- | --- | --- | --- |
| Specimen 29 | 196 | ±5.2 | 2.4 |
| Comparison 4 | 230 | ±13 | 1.5 |
| Comparison 6 | 202 | ±9 | 1.2 |

It is apparent that the present invention has better electrode lateral pressure strength than that of Comparison 6.

The maximum thickness of Specimen 30 was 196 μm, whereas that of Comparison 4 was 230 μm. The present invention is thus effective in reducing the height of resistance wiring boards. In addition, variations in the resistance value was reduced to about 30%, contributing to increased accuracy of resistance values.

Twelfth Exemplary Embodiment

A method for manufacturing a resistance wiring board in a twelfth exemplary embodiment of the present invention comprises the following steps. A first step is to form a green sheet, using the doctor blade method, from a slurry made by mixing and dispersing mixed powder with the same composition as the tenth exemplary embodiment with butyral resin, plasticizer, and solvent. A second step is to pierce the green sheet made in the first step. A third step is to fill Pd electrode paste into holes on the green sheet made in the second step, and as required, to form an electrode pattern on the green sheet with the Pd electrode paste in a way to contact with the Pd electrode paste filled into the holes. A fourth step is to use a mold to form a dent with a depth of 40 μm on a face on which the electrode pattern is not printed on the green sheet after the third step. A fifth step is to fire the molded body produced in the fourth step at a temperature appropriate to obtain a dense fired substrate. A sixth step is to fill oxidized ruthenium system resistance paste and glass paste into the dent on the fired body after the fifth step, and then fire at 650° C.

The present invention (Specimen 31 and 32) made using the above steps comprises the electrode 1, insulated substrate 2, and resistance 3, as shown in FIGS. 6A and 7A. The electrode 1 is formed through via holes or through holes on the surface on which the resistance 3 is not formed. This makes the contact area between the electrode 1 and resistance 3 uniform. The surfaces of the electrode 1 and resistance 3 are configured in a way that they are at the same level as, or lower than the surface of the insulated substrate 2.

For comparison, Comparison 7 was made by using $SiO_2$ powder instead of Si powder for the amount equivalent to Specimen 30.

Table 12 shows a comparison between Specimen 31 and 32 and Comparisons 4 and 7 with respect to the maximum thickness, variations in resistance value when 50 resistances are measured, and electrode lateral pressure strength.

TABLE 12

|  | Maximum thickness (μm) | Variations in resistance value (%) | Electrode lateral pressure strength (kgf) |
| --- | --- | --- | --- |
| Specimen 31 | 193 | ±5.2 | 2.4 |
| Specimen 32 | 202 | ±5.4 | 2.3 |
| Comparison 4 | 230 | ±13 | 1.5 |
| Comparison 7 | 199 | ±8 | 1.2 |

It is apparent that the present invention has better electrode lateral pressure strength than that of Comparison 7.

The maximum thickness of Specimen 31 and 32 were respectively 193 μm and 202 μm, whereas that of Comparison 4 was 230 μm. The present invention is thus effective in reducing the height of resistance wiring boards. In addition, variations in the resistance value was reduced to about 40%, contributing to increased accuracy of resistance values.

Thirteen Exemplary Embodiment

A method for manufacturing a resistance wiring board in a thirteenth exemplary embodiment of the present invention comprises the following steps. A first step is to form a green sheet, using the doctor blade method, from a slurry made by mixing and dispersing mixed powder with the same composition as the tenth exemplary embodiment with butyral resin, plasticizer, and solvent. A second step is to form an electrode by screen-printing Pd paste on the green sheet made in the first step. A third step is to use a mold to form a dent with a depth of 40 μm between electrode patterns on the green sheet after the second step. A fourth step is to fire the molded body produced in the third step at a temperature appropriate to obtain a dense fired substrate. A fifth step is to fill oxidized ruthenium system resistance paste into the dent on the fired body after the fourth step. A sixth step is to polish the surface of the substrate produced in the fifth step. A seventh step is to fire the substrate after the sixth step at 650° C. An eighth step is to fill fired glass paste obtained in the seventh step, and then fire at 650° C.

The present invention (Specimen 33) made using the above steps comprises the electrode 1, insulated substrate 2, and resistance 3, as shown in FIG. 1A. The electrode 1 and resistance 3 are configured in a way that they are at the same level as, or lower than the surface of the insulated substrate 2.

For comparison, Comparison 8 was made by using $SiO_2$ powder instead of Si powder for the amount equivalent to Specimen 29.

Table 13 shows a comparison between Specimen 33 and Comparisons 4 and 8 with respect to the maximum thickness, variations in resistance value when 50 resistances are measured, and electrode lateral pressure strength.

TABLE 13

|  | Maximum thickness (μm) | Variations in resistance value (%) | Electrode lateral pressure strength (kgf) |
| --- | --- | --- | --- |
| Specimen 33 | 198 | ±3.9 | 2.4 |
| Comparison 4 | 230 | ±13 | 1.5 |
| Comparison 8 | 199 | ±4.1 | 1.2 |

It is apparent that the present invention has better electrode lateral pressure strength than that of Comparison 8.

The maximum thickness of Specimen 33 was 198 μm, whereas that of Comparison 4 was 230 μm. The present invention was thus effective in reducing the height of resistance wiring boards. In addition, variations in the resistance value is reduced by about 30%, contributing to increased accuracy of resistance values.

The temperature for firing the green sheet and electrode paste is preferably between 1100° C., which is the lower limit for sufficiently densifying the substrate, and 1500° C., which is the melting point of Pd. When percentages of $TiO_2$, MnO, and $SiO_2$ are below 1.5 wt %, a dense insulated substrate cannot be achieved even at 1500° C., the upper limit for firing the electrode material. When the percentages of $TiO_2$, MnO exceed 2.5 wt % and that of Si exceeds 40 wt %, the heat conductivity of the insulated material degrades, resulting in poor overload characteristics. Accordingly, it is preferable to add between 1.5 and 2.5 wt% of $TiO_2$, between 1.5 and 2.5 wt % of MnO, and between 0.5 and 4.0 wt % of $SiO_2$. For electrode paste, 1% or more Pt may be added, depending on the substrate firing temperature. In other words, it is preferable to add 1% or more Pt to electrode paste in order to secure high temperature reliability in the electrode adhesion strength and to improve solder leaching. When the electrode adhesion strength is not required, it is not necessary to add Pt to the electrode paste.

According to a microprobe analysis of composition, a reaction phase containing more Mn element than inside the aluminum substrate exists at the boundary between the aluminum substrate and electrode. This proves that the aluminum substrate and electrode are securely bonded.

In the above explanation, a glass layer is formed on resistance material such as oxidized ruthenium as a protective coating to secure electrical insulation from the outside. A resin coating may be applied instead of a glass coating. The dent where the resistance is formed may also be inclined to facilitate mold release. This is also included in the intention of the present invention.

As described above, the present invention offers a resistance wiring substrate with good electrode adhesion strength, overload characteristics, and highly accurate resistance values whose height can be minimized.

What is claimed is:

1. A resistance wiring board comprising:
   an insulated substrate having a substrate top surface, a substrate bottom surface, and a cavity disposed in said substrate through an opening in said substrate top surface, said cavity having a center and opposite ends;
   a resistance material disposed in said cavity and having opposite ends and a resistance top surface;
   a protective film disposed on the resistance top surface and having a protective film top surface; and
   a plurality of electrodes electrically connected one to each end of said resistance material, each electrode having an electrode top surface;
   wherein each electrode top surface and the protective film top surface are level with or lower than the substrate top surface.

2. The resistance wiring board as defined in claim 1 wherein said electrodes contact a side face and bottom face of said resistance material.

3. The resistance wiring board as defined in claim 1 wherein the cavity is concavely curved such that the cavity is deeper at the center than at the opposite ends.

4. The resistance wiring board as defined in claim 1 wherein said cavity has a deepened portion near each of said ends, and a part of each electrode is formed into one of said deepened portions.

5. The resistance wiring board as defined in claim 1 further comprising a boundary face between each of said electrodes and said insulated substrate, said boundary face comprising a plurality of concavities and convexities in said insulated substrate.

6. The resistance wiring board as defined in claim 1 wherein said electrodes are disposed on the substrate bottom surface through one of a via hole and a through hole.

7. The resistance wiring board as defined in claim 1 wherein:
   said electrodes are Pd—Ag electrodes containing more than 60 wt % Pd;
   said insulated substrate is an alumina substrate containing 1.5 to 2.5 wt % $TiO_2$, 1.5 to 2.5 wt % MnO, and 1.5 to 4.5 wt % $SiO_2$; and
   said resistance wiring board further comprises a reaction phase at a boundary between said alumina substrate and said electrodes, said reaction phase having an elevated concentration of Mn that is greater than a bulk concentration of Mn in a remainder of said alumina substrate.

8. The resistance wiring board as defined in claim 1 wherein:
   said electrodes are Pd—Pt electrodes containing not less than 1 wt % Pt;
   said insulated substrate is an alumina substrate comprising 1.5 to 2.5 wt % $TiO_2$, 1.5 to 2.5 wt % $MnO_2$, 0.5 to 4.0 wt % Si; and
   said resistance wiring board further comprises a reaction phase at a boundary between said alumina substrate and said electrodes, said reaction phase having an elevated concentration of Mn that is greater than a bulk concentration of Mn in a remainder of said alumina substrate.

9. A resistance wiring board comprising:
   an alumina substrate containing $TiO_2$, Mn, and Si;
   a plurality of electrodes containing more than 60 wt % Pd on said alumina substrate;
   a resistance formed between said electrodes; and
   a reaction phase at a boundary between said alumina substrate and said electrode, said reaction phase having an elevated concentration of Mn that is greater than a bulk concentration of Mn in a remainder of the alumina substrate.

10. The resistance wiring board as defined in claim 9, wherein said electrodes comprise Pd—Ag electrodes and said alumina substrate comprises an insulated substrate containing 1.5 to 2.5 wt % of $TiO_2$, 1.5 to 2.5 wt % of MnO, and 1.5 to 4.5 wt % of $SiO_2$.

11. The resistance wiring board as defined in claim 9, wherein said electrodes comprise Pd—Pt electrodes containing more than 1 wt % Pt; and said alumina substrate comprises an insulated substrate containing 1.5 to 2.5 wt % of $TiO_2$, 1.5 to 2.5 wt % of $MnO_2$, 0.5 to 4.0 wt % of Si, and alumina.

12. A method for manufacturing a resistance wiring board comprising the steps of:
   (a) forming a green sheet comprising inorganic material comprising $TiO_2$, Mn, Si, and $Al_2O_3$;
   (b) forming an electrode pattern containing one of Pt, Pd, or a combination thereof on said green sheet;
   (c) firing said green sheet with said electrode pattern to form a fired green sheet having an electrode; and
   (d) forming a resistance on said fired green sheet;
   wherein a reaction phase is formed at a boundary between said fired green sheet and said electrode, said reaction phase having an elevated concentration of Mn that is greater than a bulk concentration of Mn in a remainder of the green sheet.

13. The method for manufacturing the resistance wiring board as defined in claim 12 wherein said method steps are performed in a sequence comprising first step (a), then step (b), then step (c), then step (d); said electrode pattern is formed using Pd—Ag electrode paste containing more than 60 wt % Pd; and said green sheet contains 1.5 to 2.5 wt % $TiO_2$, 1.5 to 2.5 wt % MnO, and 1.5 to 4.5 wt % $SiO_2$.

14. The method for manufacturing the resistance wiring board as defined in claim 12 wherein said method steps are performed in a sequence comprising first step (a), then step (b), then step (c), then step (d); said green sheet contains 1.5 to 2.5 wt % $TiO_2$, 1.5 to 2.5 wt % MnO, and 0.5 to 4.0 wt % Si; and said electrode pattern is formed using Pd—Pt electrode paste containing more than 1 wt % Pt.

15. A method for manufacturing a resistance wiring board comprising the steps of:
   (a) forming a green sheet;
   (b) forming electrode patterns on said green sheet;
   (c) forming a dent, using a mold, between said electrode patterns on said green sheet;

(d) firing said green sheet formed in said step for forming said dent;

(e) forming a resistance by filling a resistance material into said dent on said fired green sheet; and (f) forming a protective film on a top face of said resistance.

16. The method for manufacturing the resistance wiring board as defined in claim 15, wherein the method steps are performed in a sequence comprising first step (a), then step (b), then step (c), then step (d), then step (e), then step (f).

17. The method for manufacturing the resistance wiring board as defined in claim 16 wherein said green sheet contains 1.5 to 2.5 wt % $TiO_2$, 1.5 to 2.5 wt % MnO, and 1.5 to 4.5 wt % $SiO_2$; said electrode pattern is formed using Pd—Ag electrode paste containing more than 60 wt % Pd; and said Pd—Ag electrode paste is fired at temperatures between 1100° C. and 1500° C.

18. The method for manufacturing a resistance wiring board as defined in claim 16, wherein said green sheet contains 1.5 to 2.5 wt % $TiO_2$, 1.5 to 2.5 wt % MnO, and 0.5 to 4.0 wt % Si; said electrode pattern is formed using Pd—Pt electrode paste containing more than 1 wt % Pt; and said Pd—Pt electrode paste is fired at temperatures between 1100° C. and 1500° C.

19. A resistance wiring board comprising:

an alumina substrate containing $TiO_2$, Mn, and Si;

a plurality of electrodes on the alumina substrate; and a resistance formed between the electrodes.

20. A resistance wiring board comprising:

an alumina substrate having a cavity therein;

a plurality of electrodes formed on the alumina substrate; and a resistance formed between the electrodes in the cavity.

21. A resistance wiring board comprising:

a substrate comprising Mn;

a plurality of electrodes on the substrate;

a resistance formed between said electrodes; and a reaction phase at a boundary between the alumina substrate and the electrode, the reaction phase having an elevated concentration of Mn that is greater than a bulk concentration of Mn in a remainder of the substrate.

* * * * *